United States Patent
Drew

(10) Patent No.: US 6,546,100 B1
(45) Date of Patent: Apr. 8, 2003

(54) LOAD COIL DEVICE

(75) Inventor: Michael Robert Drew, Woodlawn (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/204,263

(22) Filed: Dec. 3, 1998

(51) Int. Cl.[7] .............................................. H01F 17/08
(52) U.S. Cl. .................... 379/415; 379/414; 379/93.01; 178/46
(58) Field of Search ................................. 379/414, 415, 379/400, 93.05, 93.06, 93.01; 307/102; 381/98; 178/48, 45; 370/494

(56) References Cited

U.S. PATENT DOCUMENTS

| 3,476,883 A | * 11/1969 | Birck ........................... 178/46 |
| 3,828,281 A | 8/1974 | Chambers ..................... 333/17 |
| 5,757,803 A | * 5/1998 | Russell et al. ............... 370/494 |

FOREIGN PATENT DOCUMENTS

| DE | 567 282 | 12/1932 | | |
| DE | 94 17 708 U1 | 11/1994 | .......... | H01F/37/00 |
| NL | 6711042 | 2/1969 | ............ | H04B/3/26 |

OTHER PUBLICATIONS

American Radio Relay League, The Radio Amateur's Handbook, 1973 50th Edition, pp. 42–43.*
Bigelow, Stephen J., Understanding Telephone Electronics, 1993, 3rd Edition, p. 82.*

* cited by examiner

*Primary Examiner*—Forester W. Isen
*Assistant Examiner*—Daniel Swerdlow

(57) ABSTRACT

A load coil device for a twisted pair telephone line is disclosed. The device is for compensating distributed stray capacitance in telephone lines that are longer the 18,000 feet. Typically, a load coil device would be inserted in the line every 6,000 feet. The device includes two windings, each winding to be connected in series with one of the conductors of the telephone line. The windings flatten the frequency response of the line in the voice frequency (VF) band. The device further has a capacitor connected in parallel across each winding. The values of the capacitors are chosen to provide a low impedance path that bypasses the windings for frequencies in the range of 20 kHz to 1.1 MHz. The device is particularly useful for long telephone lines over which high speed services such as asynchronous digital subscriber line (ADSL) are to be provided.

7 Claims, 3 Drawing Sheets

LOAD COIL DEVICE

FIELD OF THE INVENTION

This invention relates to frequency compensation apparatus and more particularly to tuning circuits for telephone lines.

BACKGROUND OF THE INVENTION

Distributed stray capacitance of twisted pair lines causes an insertion loss, or attenuation, that increases with frequency. In long telephone lines, that is, lines longer than 18,000 feet, this insertion loss adversely affects plain old telephone service (POTS), which operates in the voice frequency (VF) band. The VF band is the frequency range from 300 Hz to 4 kHz. Load coils added at regular intervals in a long line compensate the distributed stray capacitance, thereby flattening the frequency response of the line in the VF band. However, these added load coils increase the insertion loss at frequencies above the VF band. This loss is a problem for services such as asynchronous digital subscriber line (ADSL), which operates using high frequency signals, that is, signals in the frequency range of 20 kHz to 1.1 MHz, that range hereinafter will be referred to as the high frequency band.

SUMMARY OF THE INVENTION

An object of the present invention is to provide an improved load coil device.

According to an aspect of the present invention there is provided a load coil device for a two-conductor transmission line comprising: a first winding for connecting in series with one of the two conductors; a second winding for connecting in series with the other of the two conductors; and means for providing a low impedance path for high frequency signals to bypass the first and second windings.

Conveniently, the means comprises a first capacitor connected in parallel with the first winding, and a second capacitor connected in parallel with the second winding.

An advantage of the present invention is that by inserting it into a twisted pair transmission line it effects the line to provide a relatively flat frequency response in the VF band and a decrease in attenuation in the high frequency band compared to prior art load coils. This frequency response is particularly important for providing ADSL type services on a long line when the capability to provide POTS service on that line is to be maintained.

BRIEF DESCRIPTION OF THE DRAWINGS

The invention will be further understood from the following description with reference to the accompanying drawings, in which.

DETAILED DESCRIPTION

Figure 1:
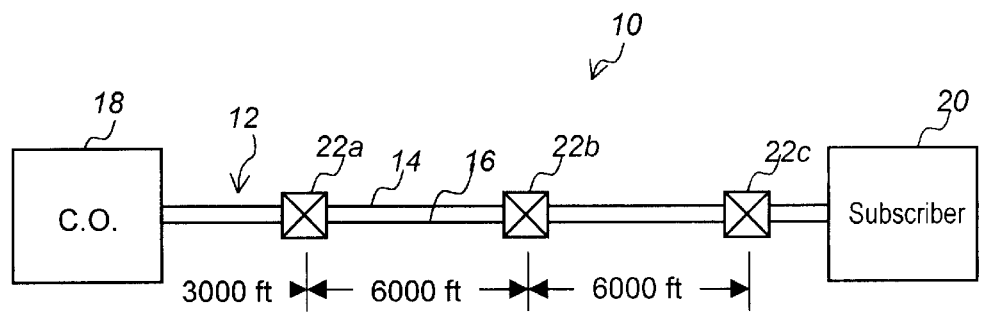
FIG. 1 is a block diagram of a telecommunications system with load coils in a transmission line.

In FIG. 1 a system 10 having load coils 22 in a twisted-pair transmission line 12 is shown. The transmission line has two conductors 14 and 16, and is connected between a central office (CO) 18 and a subscriber terminal 20. The load coils 22 are distributed along the transmission line 12 in a manner known in the art. Typically, a first load coil 22a is inserted in the transmission line 12 at a distance of 3000 feet from the CO, and each subsequent load coil 22b,22c is inserted every 6000 feet thereafter.

In operation, the load coils 22 flatten the frequency response of the transmission line 12 in the VF band. This flattening is effected by the inductance of the load coils 22 which compensates for the distributed stray capacitance that is inherent in the transmission line 12.

Figure 2:
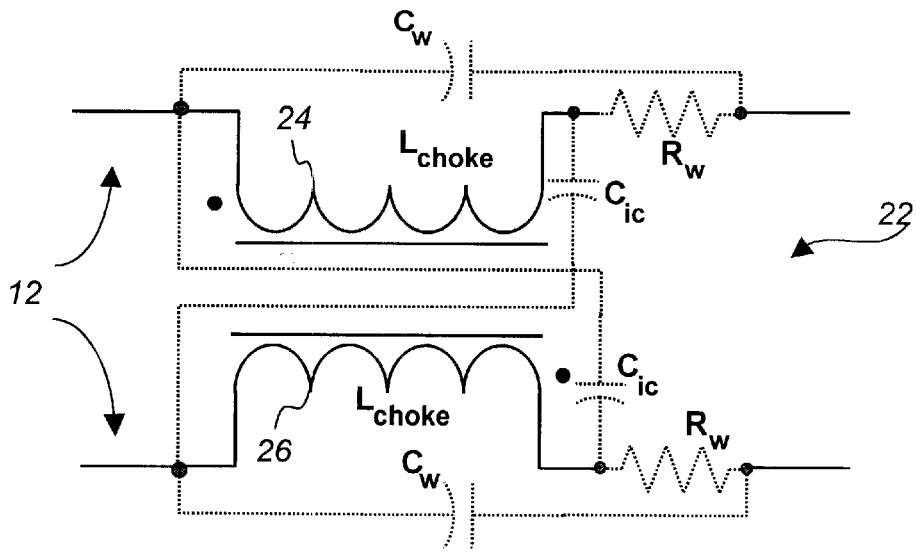
FIG. 2 is a circuit diagram of a load coil known in the prior art.

The prior art load coil shown in FIG. 2 includes two coils 24 and 26 that are wound in the opposite direction with respect to each other. Each coil 24,26 is designed to have an inductance $L_{choke}$ that will compensate for the distributed stray capacitance (not shown) of the transmission line 12. A typical value of $L_{choke}$ is 22 mH. However, in addition to having an inductance, each coil 24,26 has a parasitic winding capacitance $C_w$ and an inherent resistance $R_w$, both of which are shown in FIG. 2 and are drawn in dotted line to represent their parasitic or inherent nature. Typical values of the winding capacitance $C_w$ and winding resistance $R_w$ are 288 pF and 1.4 ohms, respectively. Furthermore, a parasitic interwinding capacitance $C_{ic}$ exists between the coils 24 and 26. This interwinding capacitance $C_{ic}$ is shown in FIG. 2 and is drawn in dotted line to represent its parasitic nature. Typically, the magnitude of the interwinding capacitance $C_{ic}$ is 1150 pF.

In operation, at VF frequencies the inductance $L_{choke}$ of the coils 24 and 26 compensates for the distributed stray capacitance of the transmission line 12, resulting in a near flat frequency response in the VF frequency band. The parasitic capacitances $C_w$ and $C_{ic}$, and the inherent winding resistance $R_w$ have a negligible effect at these frequencies. However, at high frequencies the inductance $L_{choke}$ of the coils 24 and 26 causes increasing attenuation with increasing frequency. Further, the effect of the parasitic capacitances $C_w$ and $C_{ic}$, and the inherent winding resistance $R_w$ is no longer negligible.

Figure 3:
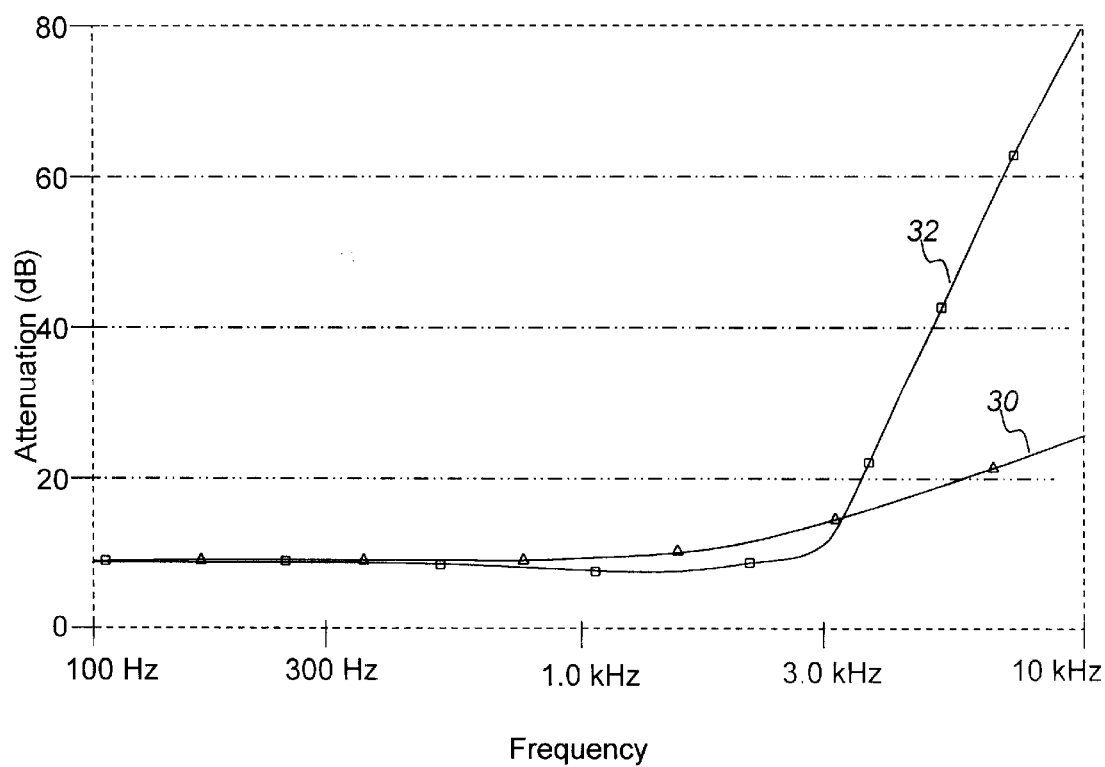
FIG. 3 is a frequency response plot of the transmission line of FIG. 1.

FIG. 3 illustrates the effect of the load coils 22 on the frequency response of the transmission line 12. Attenuation of the transmission line 12 is shown versus frequency for two conditions: a 26 gauge transmission line 12 with no load coils, represented by trace 30; and a 26 gauge transmission line 12 with the load coils 22 of FIG. 2 distributed as shown in FIG. 1, represented by trace 32. Both traces 30 and 32 were plotted using data obtained from simulation of the two conditions described above. In the simulation, the above-mentioned values of the inductance $L_{choke}$ of the coils 24 and 26, the winding capacitance $C_w$ and resistance $R_w$, and the interwinding capacitance $C_{ic}$ were used. The trace 32 shows a decrease in attenuation with respect to the trace 30 in the VF band, particularly between 1 kHz and 3 kHz. However, above the VF band the trace 32 displays an attenuation that increases dramatically with increasing frequency as a result of the load coils 22.

Figure 4:
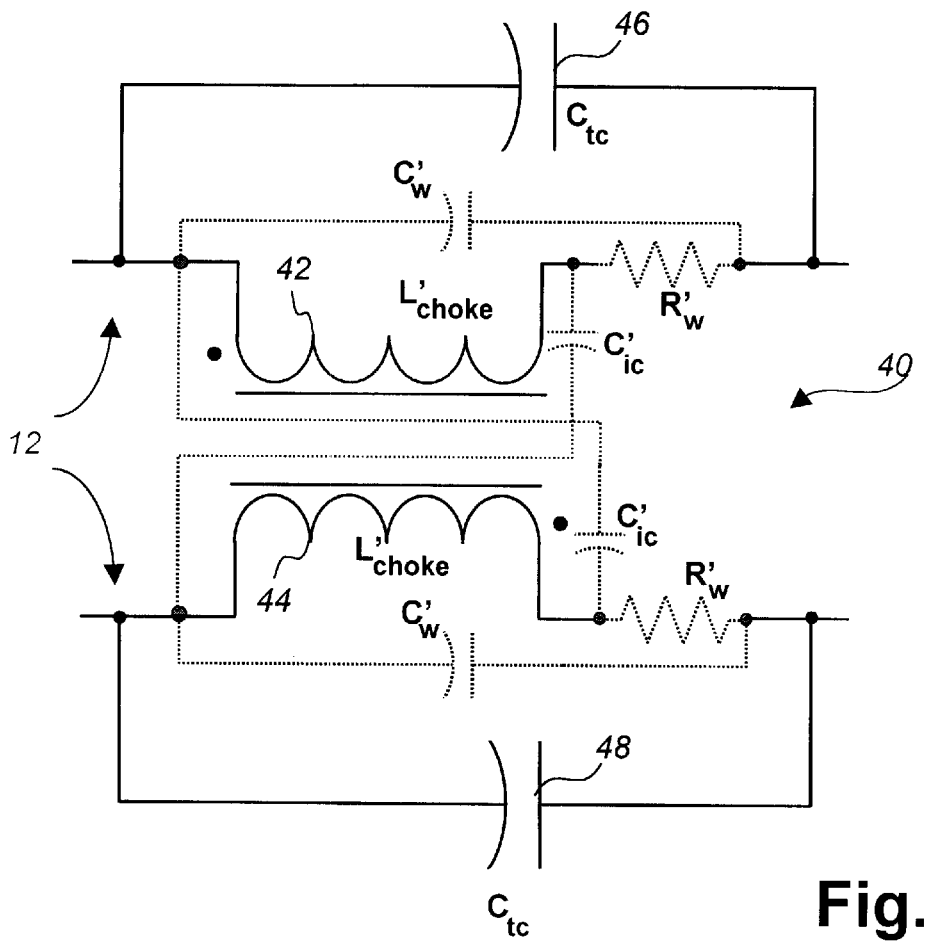
FIG. 4 is a circuit diagram of a load coil device in accordance with a first embodiment of the invention.

A load coil 40 in accordance with a first embodiment of the present invention is shown in FIG. 4. The load coil 40 includes a first winding 42 having an inductance of $L'_{choke}$ and connected in series with one of the two conductors 14,16 of the transmission line 12, and a second winding 44 also having an inductance of $L'_{choke}$ and connected in series with the other of the two conductors 14, 16 of the transmission line 12. A capacitor 46 having a capacitance of $C_{tc}$ is connected in parallel across the first winding 42, and another capacitor 48 also having a capacitance of $C_{tc}$ is connected in parallel across the second winding 44. Winding capacitance $C'_w$, winding resistance $R'_w$, and interwinding capacitance $C'_{ic}$ corresponding to the windings 42 and 44 are shown in FIG. 4. The values of these capacitances $C'_w$ and $C'_{ic}$, and the resistance $R'_w$ could be slightly different from those of the load coil in FIG. 2 depending on the value of the inductance $L'_{choke}$, the gauge of wire used in the windings 42 and 44, and their physical geometry. The values of the inductance $L'_{choke}$ and capacitance $C'_{tc}$ are 7.5 mH and 100 nF, but they could be in the ranges of 2.5 mH to 10 mH and 50 nF to 200 nF, respectively.

In operation, the windings 42 and 44 compensate for the distributed stray capacitance of the transmission line 12. The capacitors 46 and 48 provide a low impedance path for high frequency signals to bypass the first and second windings 42 and 44.

Figure 5:
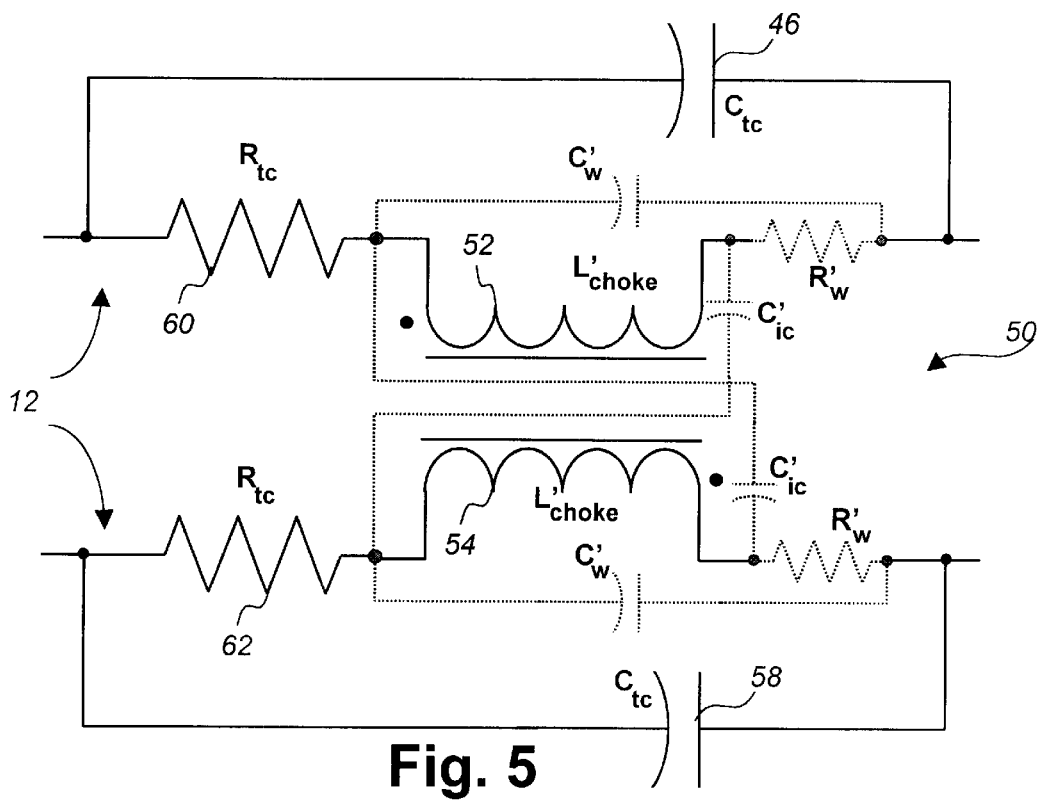
FIG. 5 is a circuit diagram of a load coil device in accordance with a second embodiment of the invention.

A load coil 50 in accordance with a second embodiment of the present invention is shown in FIG. 5. The load coil 50 includes a first winding 52 having an inductance $L'_{choke}$ connected in series with one of the two conductors 14, 16 of the transmission line 12, and a second winding 54 also having an inductance $L'_{choke}$ connected in series with the other of the two conductors 14, 16. A first resistor 60 having a resistance of $R_{tc}$ is connected in series with the first winding 52. Similarly, a second resistor 62 having a resistance of $R_{tc}$ is connected in series with the second winding 54. A first capacitor 56 having a capacitance of $C_{tc}$ is connected in parallel across the first winding 52 and the first resistor 60. Similarly, a second capacitor 58 having a capacitance of $C_{tc}$ is connected in parallel across the second winding 54 and the second resistor 62. Parasitic capacitances $C'_w$ and $C'_{ic}$, and inherent winding resistance $R'_w$ corresponding to the windings 52 and 54 are shown in FIG. 5.

In operation, the load coil 50 operates in a similar manner as the coil of FIG. 4, with an exception. The addition of resistance $R_{tc}$ provides dampening of frequencies at the resonant frequency of the load coil 50, the resonant frequency depending primarily on the inductance $L'_{choke}$ and the capacitance $C_{tc}$. The value of $R_{tc}$ should be low to minimize the DC resistance that it will add to the transmission line 12. The value of the resistance $R_{tc}$ is 20 ohms, but could be in the range of 10 ohms to 200 ohms. The values and ranges of the capacitance $C_{tc}$ and the inductance $L'_{choke}$ are the same as those of the load coil 40 in FIG. 4.

Figure 6:
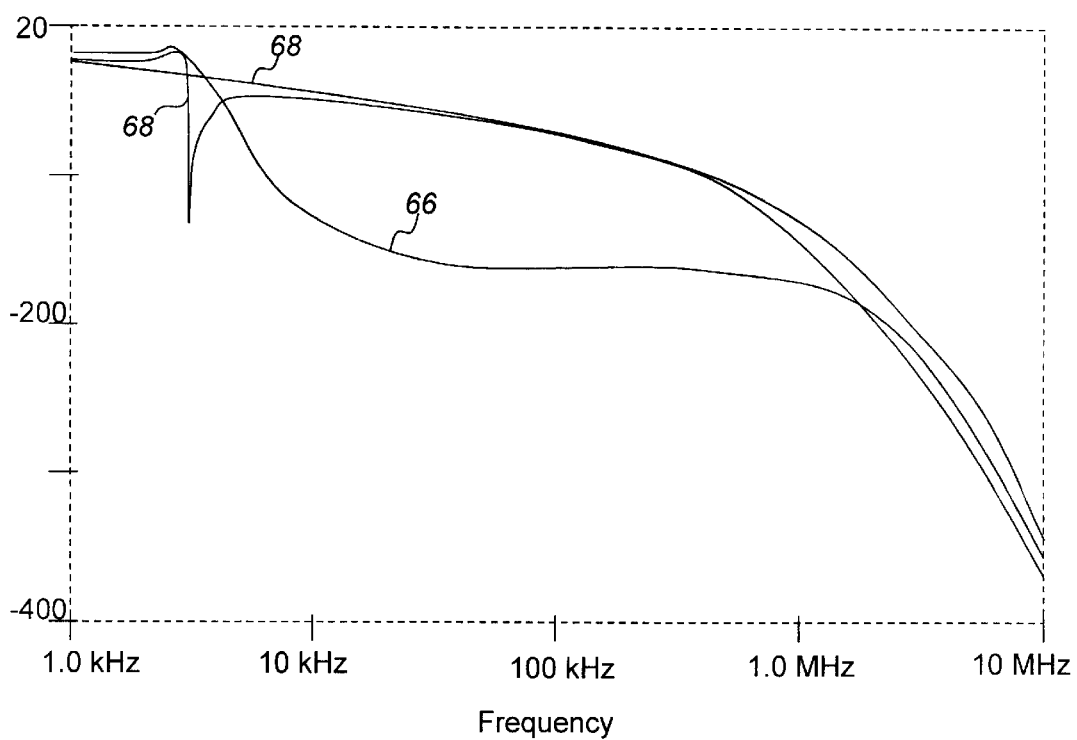
FIG. 6 is a plot illustrating the frequency response of a transmission line with: the load coils of FIG. 4, the load coils of FIG. 2, and no load coils.

FIG. 6 is a plot illustrating the frequency response of the transmission line 12 under the following conditions: the load coils 40 of FIG. 4 distributed as shown in FIG. 1, the response under this condition represented by trace 64; the load coils 22 (prior art) of FIG. 2 also distributed as shown in FIG. 1, the response under this condition represented by trace 66; and no load coils, the response under this condition represented by trace 68. The trace 64 shows a significant improvement in frequency response at high frequencies over the trace 66 (37.5 dB less attenuation at 400 kHz). In addition, the trace 64 shows that the frequency response in the VF band is comparable to that of the trace 66. Thus, the load coils 40 effect the transmission line 12 to provide a relatively flat frequency response in the VF band for POTS service while decreasing the attenuation in the high frequency band compared to the prior art load coils 22. This reduced attenuation in the high frequency band is important for providing ADSL type services on a long line.

Numerous modifications, variations, and adaptations may be made to the particular embodiments of the invention described above without departing from the scope of the invention, which is defined in the claims.

What is claimed is:

1. A load coil device for a two-conductor transmission line comprising:

a first winding for connecting in series with one of the two conductors of the transmission line;

a second winding for connecting in series with the other of the two conductors of the transmission line; and means for providing a low impedance path for high frequency signals around the first and second windings, including a first capacitor connected in parallel with the first winding and a second capacitor connected in parallel with the second winding, said first and second capacitors each having a capacitance in the range of 50 nF to 200 nF and said first and second windings each having an inductance in the range of 2.5 mH to 10 mH.

2. A load coil device as claimed in claim 1, wherein the means further comprises:

a first resistor connected in series with the first winding; and a second resistor connected in series with the second winding.

3. A load coil device as claimed in claim 1, wherein the first winding and second windings are wound in opposite directions to each other.

4. A load coil device as claimed in claim 2, wherein the first winding and second windings are wound in opposite directions to each other.

5. A load coil device as claimed in claim 2, wherein the first and second resistors each have a resistance in the range of 10 ohms to 200 ohms.

6. A load coil device as claimed in claim 1, wherein said load coil device is provided for an asynchronous digital subscriber line (ADSL).

7. A load coil device for an asynchronous digital subscriber line (ADSL) comprising:

a first winding for connecting in series with a first conductor of a transmission line;

a second winding for connecting in series with a second conductor of the transmission line; and means for providing a low impedance path for high frequency signals around the first and second windings, said means including a first resistor connected in series with the first winding, a first capacitor connected in parallel with the series connected first resistance and first winding, a second resistor connected in series with the second winding and a second capacitor connected in parallel with the series connected second resistance and second winding, the first and second windings each have an inductance in the range of 2.5 mH to 10 mH, the first and second capacitors each have a capacitance in the range of 50 nF to 200 nF, and the first and second resistors each have a resistance in the range of 10 ohms to 200 ohms.

\* \* \* \* \*